US011088300B2

(12) United States Patent
Gibert et al.

(10) Patent No.: US 11,088,300 B2
(45) Date of Patent: Aug. 10, 2021

(54) OPTOELECTRONIC DEVICE

(71) Applicant: Aledia, Grenoble (FR)

(72) Inventors: Philippe Gibert, Saint Etienne de Crossey (FR); Philippe Gilet, Teche (FR); Ewen Henaff, Fontaine (FR); Thomas Lacave, Grenoble (FR)

(73) Assignee: Aledia, Echirolles (FR)

( * ) Notice: Subject to any disclaimer, the term of this patent is extended or adjusted under 35 U.S.C. 154(b) by 38 days.

(21) Appl. No.: 16/626,292

(22) PCT Filed: Jun. 19, 2018

(86) PCT No.: PCT/FR2018/051471
§ 371 (c)(1),
(2) Date: Dec. 23, 2019

(87) PCT Pub. No.: WO2019/002720
PCT Pub. Date: Jan. 3, 2019

(65) Prior Publication Data
US 2020/0119231 A1 Apr. 16, 2020

(30) Foreign Application Priority Data

Jun. 30, 2017 (FR) ...................................... 1756149

(51) Int. Cl.
*H01L 33/40* (2010.01)
*H01L 33/06* (2010.01)
*H01L 33/08* (2010.01)
*H01L 33/24* (2010.01)
*H01L 33/28* (2010.01)
(Continued)

(52) U.S. Cl.
CPC ............ *H01L 33/405* (2013.01); *H01L 33/06* (2013.01); *H01L 33/08* (2013.01); *H01L 33/24* (2013.01);
(Continued)

(58) Field of Classification Search
CPC ........ H01L 33/405; H01L 33/06; H01L 33/08; H01L 33/24; H01L 33/28; H01L 33/30;
(Continued)

(56) References Cited

U.S. PATENT DOCUMENTS 10,381,521 B2 * 8/2019 Hoppel ............. H01L 31/03046
2016/0087151 A1 3/2016 Chiu et al.
(Continued)

FOREIGN PATENT DOCUMENTS

WO WO 2015/044622 A1 4/2015

OTHER PUBLICATIONS

PCT/FR2018/051471, Sep. 10, 2018, International Search Report and Written Opinion.
(Continued)

*Primary Examiner* — Mark W Tornow
(74) *Attorney, Agent, or Firm* — Wolf, Greenfield & Sacks, P.C.

(57) ABSTRACT

An optoelectronic device including: a support; blocks of a semiconductor material, resting on the support and each including a first surface on the side opposite to the support and lateral walls; a nucleation layer on each first surface; a first insulating layer covering each nucleation layer and including an opening exposing a portion of the nucleation layer; a semiconductor element resting on each first insulating layer and in contact with the nucleation layer covered with the first insulating layer in the opening; a shell covering each semiconductor element and including an active layer capable of emitting or absorbing an electromagnetic radiation; and a first conductive layer, reflecting the radiation, extending between the semiconductor elements and extending over at least a portion of the lateral walls of the blocks.

19 Claims, 9 Drawing Sheets

(51) Int. Cl.
*H01L 33/30* (2010.01)
*H01L 33/34* (2010.01)
*H01L 33/38* (2010.01)
*H01L 33/42* (2010.01)
*H01L 33/44* (2010.01)

(52) U.S. Cl.
CPC .............. *H01L 33/28* (2013.01); *H01L 33/30* (2013.01); *H01L 33/34* (2013.01); *H01L 33/387* (2013.01); *H01L 33/42* (2013.01); *H01L 33/44* (2013.01); *H01L 2933/0016* (2013.01); *H01L 2933/0025* (2013.01)

(58) Field of Classification Search
CPC ....... H01L 33/34; H01L 33/387; H01L 33/42; H01L 33/44; H01L 2933/0016; H01L 2933/0025
See application file for complete search history.

(56) References Cited

U.S. PATENT DOCUMENTS

| | | | |
|---|---|---|---|
| 2017/0222108 A1* | 8/2017 | Chang | H01L 33/62 |
| 2018/0190877 A1* | 7/2018 | Hirano | H01L 33/382 |
| 2018/0337308 A1* | 11/2018 | Chong | H01L 33/44 |
| 2019/0019918 A1* | 1/2019 | Vaufrey | H01L 33/382 |
| 2019/0341526 A1* | 11/2019 | Kopp | H01L 33/382 |

OTHER PUBLICATIONS

International Search Report and Written Opinion for International Application No. PCT/FR2018/051471, dated Sep. 10, 2018.
International Preliminary Examination Report for International Application No. PCT/FR2018/051471, dated Jan. 9, 2020.

* cited by examiner

U.S. 11,088,300 B2

OPTOELECTRONIC DEVICE

RELATED APPLICATIONS

This Application is a national stage filing under 35 U.S.C. § 371 of International Patent Application Serial No. PCT/FR2018/051471, filed Jun. 19, 2018, which claims priority to French patent application FR 17/56149. The entire contents of which are incorporated herein by reference in their entirety.

BACKGROUND

The present invention generally concerns optoelectronic devices made up of semiconductor materials and methods of manufacturing the same.

DISCUSSION OF THE RELATED ART

The term "optoelectronic devices" is used to designate devices capable of converting an electric signal into an electromagnetic radiation or conversely, and especially devices dedicated to detecting, measuring, or emitting an electromagnetic radiation, or devices dedicated to photovoltaic applications.

Radial-type optoelectronic devices comprising three-dimensional semiconductor elements and an active layer formed at the periphery of each three-dimensional element are here more particularly considered. The region from which most of the electromagnetic radiation supplied by the optoelectronic device is emitted or where most of the electromagnetic radiation received by the optoelectronic device is captured is called active layer of the optoelectronic device.

Examples of three-dimensional elements are microwires or nanowires comprising a semiconductor material made up of a compound mainly comprising at least one group-III element and one group-V element (for example, gallium nitride GaN), called III-V compound hereafter, or mainly comprising at least one group-II element and one group-VI element (for example, zinc oxide ZnO), called II-VI compound hereafter. Such devices are for example described in U.S. Pat. Nos. 9,245,948 and 9,537,044.

FIG. 1 is a partial simplified cross-section view of an optoelectronic device 10 capable of emitting an electromagnetic radiation and where the semiconductor elements correspond to nanowires or to microwires.

Device 10 comprises, from bottom to top in FIG. 1:

a first biasing electrode 12;

a substrate 14, for example, semiconductor, comprising parallel surfaces 16 and 18, surface 16 being in contact with electrode 12;

a nucleation layer 20 covering surface 18;

an electrically-insulating layer 22 covering nucleation layer 20 and comprising openings 24, a single opening 24 being shown in FIG. 1, at the desired locations of the wires;

wires 26, a single wire 26 being shown, each wire 26 being in contact with nucleation layer 20, in one of openings 24;

a shell 28 covering the external wall of each wire 26, shell 28 comprising the active layer;

an electrically-insulating layer 30 covering the periphery of a lower portion of each shell 28;

an electrically-conductive layer 32 transparent to the radiation emitted by the active layer, covering each shell 28, each insulating layer 30, and insulating layer 22 between wires 26;

an electrically-conductive layer 34 reflective for the radiation emitted by the active layer, extending over layer 32 between wires 26 and forming the second electrode; and an electrically-insulating encapsulation layer 36 transparent to the radiation emitted by the active layer and covering the entire structure.

The assembly formed by each wire 26 and the shell 28 covering it forms a light-emitting diode. Insulating layer 30 enables to avoid, for each light-emitting diode, electric leakages in the lower portion of wire 26. Conductive layer 34 is used to diffuse the current to all the light-emitting diodes and to reflect the light rays emitted by the light-emitting diodes.

The method of manufacturing conductive layer 34 generally imposes for conductive layer 34 to cover a lower portion of each wire 26.

The extraction efficiency of an optoelectronic device is generally defined by the ratio of the number of photons escaping from the optoelectronic device to the number of photons emitted by the light-emitting diodes. It is desirable for the extraction efficiency of an optoelectronic device to be as high as possible.

A disadvantage of optoelectronic device 10 is that a fraction of the photons emitted by each light-emitting diode is reflected towards the inside of wire 26 by conductive layer 34 and does not escape from optoelectronic device 10.

Another disadvantage of device 10 is that, to independently control a light-emitting diode or a group of light-emitting diodes, electric insulation trenches should be formed in substrate 14 to insulate, for said light-emitting diode or said group of light-emitting diodes, the portion of substrate 14 coupling electrode 12 to wires 26. The methods of forming electric insulation trenches may be complex and limiting concerning the general integration of the targeted product.

SUMMARY

Thus, an object of an embodiment is to at least partly overcome the disadvantages of the previously-described optoelectronic devices and of their manufacturing methods.

Another object of an embodiment is to increase the extraction efficiency of the optoelectronic device.

Another object of an embodiment is to improve the diffusion of the current towards the light-emitting diodes.

Another object of an embodiment is to ease the achieving of an independent control of the light-emitting diodes.

Thus, an embodiment provides an optoelectronic device comprising:

a support;

blocks of a semiconductor material, resting on the support and each comprising a first surface on the side opposite to the support and lateral walls;

a nucleation layer on each first surface;

a first electrically-insulating layer covering each nucleation layer and comprising an opening exposing a portion of the nucleation layer;

a semiconductor element resting on each first insulating layer and in contact with the nucleation layer covered with the first insulating layer in the opening;

a shell covering each semiconductor element and comprising an active layer capable of emitting or absorbing an electromagnetic radiation; and a first electrically-conductive layer reflecting the radiation, extending between the semiconductor elements and extending over at least a portion of the lateral walls of the blocks.

According to an embodiment, the optoelectronic device further comprises a second electrically-insulating layer covering at least a lower portion of each semiconductor element.

According to an embodiment, the optoelectronic device further comprises a second electrically-conductive layer, at least partly transparent to the radiation and covering each shell.

According to an embodiment, the optoelectronic device further comprises an electrically-insulating encapsulation layer at least partly transparent to the radiation and covering the first and second electrically-conductive layers.

According to an embodiment, each nucleation layer comprises at least a stack of a third electrically-conductive layer in contact with the associated semiconductor element and of a fourth layer less electrically conductive than the third conductive layer, in contact with the block and covered with the third conductive layer.

According to an embodiment, the support comprises a third electrically-insulating layer having second and third opposite surfaces, the blocks resting on the third surface.

According to an embodiment, the optoelectronic device further comprises at least one first electrode partly extending over the fourth surface and in contact with one of the blocks through the third insulating layer and at least one second electrode in contact with the second conductive layer through the third insulating layer.

According to an embodiment, the height of each block is in the range from 0.5 μm to 4 μm.

According to an embodiment, the second conductive layer does not extend over the lateral walls of the semiconductor elements, the second conductive layer extending over at least a portion of the lateral walls of each block along a height measured from the support smaller than or equal to the height of the block measured from the support.

According to an embodiment, the optoelectronic device comprises a semiconductor portion in contact with at least two of the blocks.

According to an embodiment, the semiconductor element is a nanowire, a microwire, or a nanometer- or micrometer-range pyramid.

According to an embodiment, the semiconductor elements are at least partly made of a material selected from the group comprising III-V compounds, II-VI compounds, or group-IV semiconductors or compounds.

According to an embodiment, each nucleation layer is at least partly made of aluminum nitride, of aluminum oxide, of boron, of boron nitride, of titanium, of titanium nitride, of tantalum, of tantalum nitride, of hafnium, of hafnium nitride, of niobium, of niobium nitride, of zirconium, of zirconium borate, of zirconium nitride, of silicon carbide, of tantalum carbo-nitride, of magnesium nitride in $Mg_xN_y$ form, where x is approximately equal to 3 and y is approximately equal to 2, for example, magnesium nitride in $Mg_3N_2$ form.

An embodiment also provides a method of manufacturing an optoelectronic device, comprising the steps of:

forming, on a support, blocks of a semiconductor material, each comprising a first surface on the side opposite to the support and lateral walls, a nucleation layer on each first surface, and a first electrically-insulating layer covering each nucleation layer and comprising an opening exposing a portion of the nucleation layer;

forming a semiconductor element resting on each first insulating layer and in contact with the nucleation layer covered with the first insulating layer in the opening;

forming a shell covering each semiconductor element and comprising an active layer capable of emitting or absorbing an electromagnetic radiation; and forming a first electrically-conductive layer reflecting the radiation, extending between the semiconductor elements and extending over at least a portion of the lateral walls of the blocks.

According to an embodiment, the method further comprises forming a second electrically-insulating layer at least partly covering a lower portion of each semiconductor element.

According to an embodiment, the method further comprises forming a second electrically-conductive layer, at least partly transparent to the radiation and covering at least each shell.

According to an embodiment, the method further comprises forming an electrically-insulating encapsulation layer at least partly transparent to the radiation and covering the first and second electrically-conductive layers.

According to an embodiment, the support comprises a third electrically-insulating layer having opposite second and third surfaces, the blocks being formed on the third surface.

According to an embodiment, the method further comprises forming at least one first electrode partly extending over the fourth surface and in contact with one of the blocks through the third insulating layer and forming at least one second electrode in contact with the second conductive layer through the third insulating layer.

According to an embodiment, the method further comprises forming, on the support, a semiconductor layer, and forming, on the semiconductor portion, at least two of the blocks in contact with the semiconductor portion.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1:
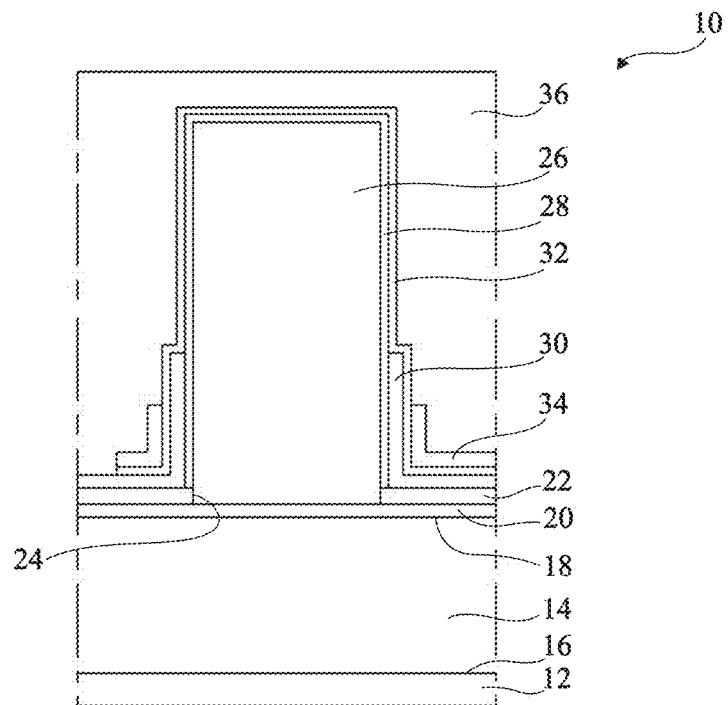
FIG. 1, previously described, is a partial simplified cross-section view of an example of an optoelectronic device comprising microwires or nanowires.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for controlling the optoelectronic device described hereafter are within the abilities of those skilled in the art and are not described. The terms "substantially", "approximately", and "in the order of" are used herein to designate a tolerance of plus or minus 10% of the value in question.

The present description relates to optoelectronic devices comprising semiconductor elements having the shape of microwires, of nanowires, or of pyramids.

Term "microwire" or "nanowire" designates a three-dimensional structure having an elongated shape, for example, cylindrical, conical, or tapered, along a preferred direction, having at least two dimensions, called minor dimensions, in the range from 5 nm to 2.5 µm, preferably from 50 nm to 2.5 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 µm, preferably in the range from 10 nm to 1 µm, more preferably from 20 nm to 800 nm. In certain embodiments, the height of each microwire or nanowire may be greater than or equal to 500 nm, preferably in the range from 1 µm to 50 µm.

In the following description, the term "wire" is used to mean "microwire" or "nanowire". Preferably, the median line of the wire which runs through the centers of gravity of the cross-sections, in planes perpendicular to the preferred direction of the wire, is substantially rectilinear and is called "axis" of the wire hereafter. The base of the wire for example has an oval, circular, or polygonal shape, particularly triangular, rectangular, square, or hexagonal. The cross-section of the wire may be constant along the wire axis or may vary along the wire axis. As an example, the wire may have a cylindrical shape with a circular or non-circular base, or may have a conical or tapered shape.

In the following description, the term pyramid or truncated pyramid designates a three-dimensional structure having a pyramidal shape. The pyramidal structure may be truncated, that is, the top of the cone is absent and replaced with a flat area. The base of the pyramid is inscribed within a polygon having a side dimension from 100 nm to 10 µm, preferably from 1 to 3 µm. The polygon forming the base of the pyramid may be a hexagon. The height of the pyramid between the base of the pyramid and the apex or the top plateau varies from 100 nm to 20 µm, preferably from 1 µm to 10 µm.

In the following description, embodiments will be described in the case of an optoelectronic device comprising light-emitting diodes. It should however be clear that these embodiments may concern other applications, particularly devices dedicated to electromagnetic radiation detection or measurement or devices dedicated to photovoltaic applications.

Figure 2:
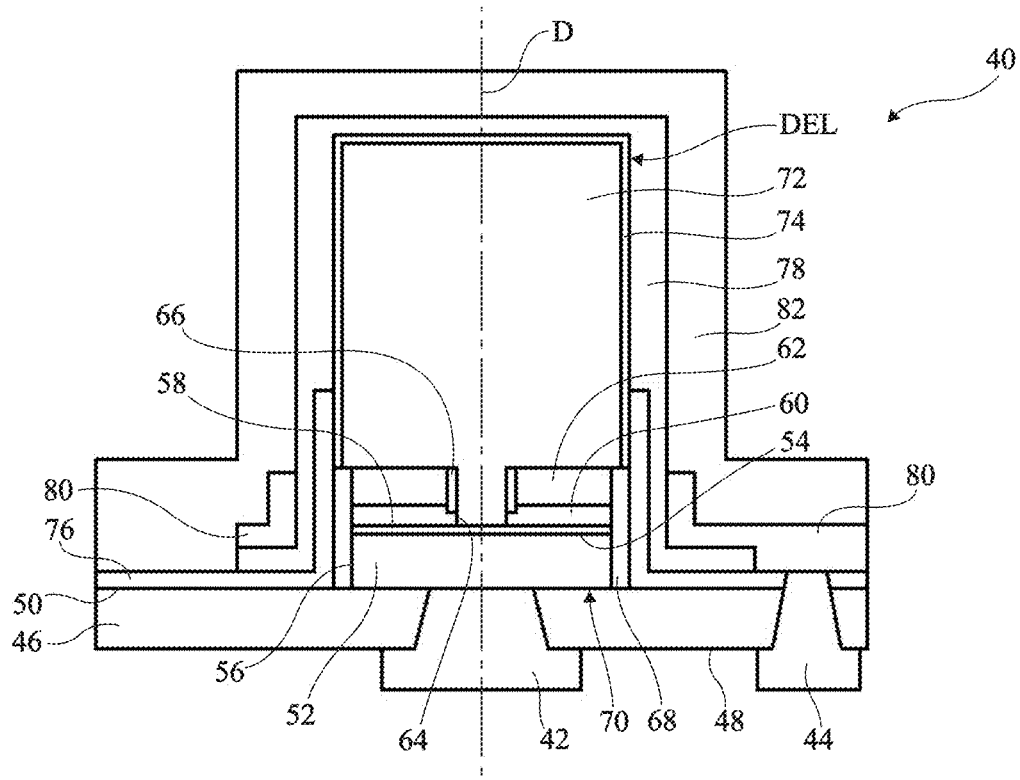
FIGS. 2 to 6 are partial simplified cross-section views of embodiments of an optoelectronic device comprising microwires or nanowires.

FIG. 2 is a partial simplified cross-section view of an optoelectronic device 40 formed from wires such as previously described and capable of emitting an electromagnetic radiation. An embodiment will now be described for a single wire, knowing that the structure is repeated for each wire.

Device 40 comprises, from bottom to top in FIG. 1:
a first biasing electrode 42 and a second biasing electrode 44;
a support 46 made of an electrically-insulating material, comprising a lower surface 48 and an upper surface 50, the first and second electrodes 42, 44 partly extending over lower surface 48;
a block 52 made of an electrically-conductive or semiconductor material resting on upper surface 50 of support 46 and in contact with support 46 and comprising an upper surface 54, on the side opposite to support 46, and lateral walls 56, first electrode 42 being in contact with block 52 through support 46;
a nucleation layer 58, also called seed layer, covering upper surface 54;
a stack covering nucleation layer 58 comprising a first electrically-insulating layer 60 and a second electrically-insulating layer 62;
an opening 64 crossing the first and second insulating layers 60, 62 and exposing a portion of nucleation layer 58, a portions of the sides of opening 64 being covered with an electrically-insulating coating 66;
an electrically-insulating coating 68 covering the outer sides of block 52, of nucleation layer 58, and of the first and second insulating layers 60, 62, the assembly comprising block 52, nucleation layer 58, the first and second insulating layers 60, 62, and insulating coatings 66, 68 forming a pedestal 70;
a wire 72 of axis D resting on pedestal 70;
a shell 74 covering wire 72, shell 74 comprising the active layer of the light-emitting diode, the assembly formed by wire 72 and shell 74 forming a light-emitting diode LED;
an electrically-insulating layer 76 covering support 46 and extending over the lateral sides of pedestal 70 and over a lower portion of shell 74;
an electrically-conductive layer 78 transparent to the radiation emitted by the active layer, covering shell 74 and the portion of insulating layer 76 rising on shell 74;
an electrically-conductive layer 80 reflective to the radiation emitted by the active layer, extending on layer 78 and around light-emitting diodes LED, second electrode 44 being in contact with conductive layer 80 through support 46 and insulating layer 76; and
an electrically-insulating encapsulation layer 82 transparent to the radiation emitted by the active layer and covering the entire structure.

When a plurality of light-emitting diodes LED are formed on support 46, they may be connected in series and/or in parallel and form an assembly of light-emitting diodes. The assembly may comprise from a few light-emitting diodes LED to some thousand light-emitting diodes LED. In particular, conductive layer 80 may couple a plurality of light-emitting diodes LED. As an example, FIG. 2 shows the layer 80 which, in the right-hand portion of FIG. 2, extends on layer 76 beyond layer 78 to indicate that layer 80 may be coupled to another light-emitting diode, not shown, which would be located more to the right, while, in the left-hand portion of FIG. 2, layer 80 is shows as not extending leftwards beyond layer 78 to show the case where layer 80 is not coupled to a light-emitting diode, not shown, which would be located more to the left.

Figure 3:
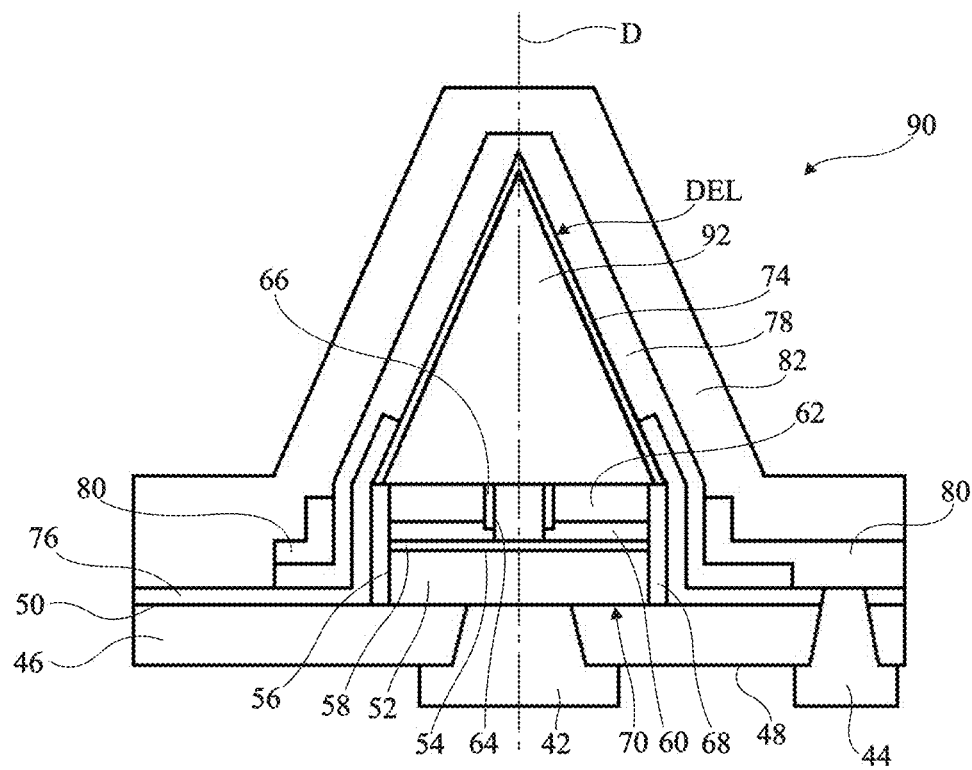

FIG. 3 is a partial simplified cross-section view of an optoelectronic device 90. Optoelectronic device 90 comprises all the elements of the optoelectronic device 40 shown in FIG. 2, with the difference that wire 72 is replaced with a pyramid 92 of axis D resting on pedestal 70.

According to an embodiment, the upper limit of the conductive and reflective layer 80 measured along axis D from surface 50 is smaller than the upper limit of insulating layer 62 and/or of insulating layer 76. Thereby, conductive layer 80 does not cover shells 74. Advantageously, conductive layer 80 then does not block the photons emitted by the active layers of shells 74 which may escape out of light-emitting diodes LED. The extraction efficiency of optoelectronic device 40 or 90 is thus increased.

The thickness of the conductive layer 80 of optoelectronic device 40 or 90 may advantageously be increased with respect to that of conductive layer 34 of optoelectronic device 10. The diffusion of the current to the light-emitting diodes is thus improved.

Support 46 may be made of an electrically-insulating material. This advantageously enables to easily achieve an independent control of each light-emitting diode or of groups of light-emitting diodes without having to form electric insulation trenches in support 46.

The three-dimensional semiconductor elements, which correspond to wire 72 or to pyramid 92 in the previously-described embodiments are at least partly made up of at least one semiconductor material. The semiconductor material is selected from the group comprising III-V compounds, II-VI compounds, or group-IV semiconductors or compounds.

The semiconductor elements may be at least partly made of semiconductor materials mainly comprising a III-V compound, for example, a III-N compound. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

The semiconductor elements may be at least partly made from semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

The semiconductor elements may be at least partly made of semiconductor materials mainly comprising at least one group-IV compound. Examples of group-IV semiconductor materials are silicon (Si), carbon (C), germanium (Ge), silicon carbide alloys (SiC), silicon-germanium alloys (SiGe), or germanium carbide alloys (GeC).

Semiconductor elements 72, 92 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn). The dopant concentration in the semiconductor element may vary according to the axis of the semiconductor element. In particular, when the three-dimensional semiconductor elements of the optoelectronic device correspond to wires 72, the dopant concentration may be greater at the base of the wire than at the top of the wire.

The axes of two adjacent semiconductor elements 72, 92 may be distant by from 0.1 µm to 15 µm and preferably from 0.3 µm to 5 µm. As an example, semiconductor elements 72, 92 may be regularly distributed, for example, in rows and/or in columns.

Support 46 is made of an electrically-insulating material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of hafnium oxide ($HfO_2$), or of diamond. The thickness of support 46 may be in the range from 100 nm to 2 µm, preferably from 0.3 µm to 1 µm.

Block 52 is preferably made of a semiconductor material, for example, made of silicon, of germanium, of silicon carbide, of a III-V compound, such as GaN or GaAs, or a ZnO substrate. Preferably, block 52 is made of single-crystal silicon. Block 52 may be heavily doped, lightly doped, or non-doped. In the case where the substrate is heavily doped, block 52 may be doped to lower the electric resistivity down to a resistivity close to that of metals, preferably smaller than a few mohms·cm. In the case of a silicon block 52, examples of P-type dopant are boron (B) or indium (In) and examples of N-type dopants are phosphorus (P), arsenic (As), or antimony (Sb) Surface 54 of silicon block 52 may be a (100) surface or a (111) surface. The height of each block 52, measured along axis D, is in the range from 0.3 µm to 7 µm and preferably from 1 µm to 4 µm. The diameter of each opening 64 may vary from 10 nm to 1 µm.

In top view along axis D, the diameter of the circle inscribed within block 52 is substantially equal to the maximum diameter of the circle inscribed within wire 72 or within the base of pyramid 92 resting on block 52.

Each electrode 42, 44 may be made of a single electrically-conductive material or correspond to a stack of at least two layers made of different electrically-conductive materials selected from the group comprising nickel silicide (NiSi), aluminum (Al), aluminum silicide (AlSi), titanium (Ti), titanium nitride (TiN), titanium silicide (TiSi), an alloy of titanium, nickel, and gold (TiNiAu), an alloy of aluminum and copper (AlCu), copper (Cu), an alloy of titanium and of tungsten (TiW), ruthenium (Ru), silver (Ag), and tungsten (W).

Seed layer 58 is made of a material favoring the growth of semiconductor elements 72, 92. As an example, the material forming seed layer 58 may be a nitride, a carbide, or a boride of a transition metal from column IV, V, or VI of the periodic table of elements, or a combination of these compounds. As an example, seed layer 58 may be made of aluminum nitride (AlN), of aluminum oxide ($Al_2O_3$), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate ($ZrB_2$), of zirconium nitride (ZrN), of silicon carbide (SiC), of tantalum carbide nitride (TaCN), of magnesium nitride in $Mg_xN_y$ form, where x is approximately equal to 3 and y is approximately equal to 2, for example, magnesium nitride in $Mg_3N_2$ form. Seed layer 58 may be doped with the same conductivity type as block 52. Seed layer 58 for example has a thickness in the range from 1 nm to 200 nm, preferably in the range from 10 nm to 50 nm. Seed layer 58 may be formed of an alloy or of a stack of one or a plurality of materials mentioned in the above list.

Saying that a compound made up of at least a first element and of a second element has a polarity of the first element or a polarity of the second element means that the material grows along a preferred direction and that when the material is cut in a plane perpendicular to the preferred growth direction, the exposed surface essentially comprises atoms of the first element in the case of the polarity of the first element or atoms of the second element in the case of the polarity of the second element.

The material forming seed layer 58 is selected to favor the growth of semiconductor elements according to a given polarity. In the case of GaN semiconductor elements, to obtain wires 72, seed layer 58 may favor the growth of GaN with the N polarity and, to obtain pyramids 92, seed layer 58 may favor the growth of GaN with the Ga polarity.

Insulating layers 60, 62, 76 and/or insulating coatings 66, 68 may each be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of hafnium oxide ($HfO_2$), or of diamond. As an example, insulating layers 60 and 76 are made of $SiO_2$ and insulating layer 62 and coatings 66, 68 are made of $Si_3N_4$.

As an example, the thickness of insulating layer 60 is in the range from 5 nm to 1 µm. As an example, the thickness of insulating layer 62 is in the range from 5 nm to 1 µm. As an example, the thickness of each insulating coating 66, 68 is in the range from 20 nm to 500 nm. As an example, the thickness of insulating layer 76 is in the range from 20 nm to 1 µm. As a variation, the two insulating layers 60 and 62 may correspond to a single insulating layer. The height of the rise of insulating layer 76 on pedestals 70 and semiconductor elements 72, 92 is greater than that height of pedestals 70.

Shell 74 may comprise a stack of a plurality of layers especially comprising:
- an active layer covering the associated three-dimensional semiconductor element 72, 92;
- an intermediate layer having a conductivity type opposite to that of the semiconductor element and covering the active layer; and
- a coupling layer covering the intermediate layer and covered with transparent conductive layer 78. The total thickness of shell 74 is for example in the range from 20 nm to 1 µm.

The active layer is the layer from which most of the radiation supplied by the elementary light-emitting diode is emitted. According to an example, the active layer may comprise means for confining electric charge carriers, such as a single quantum well or multiple quantum wells. It is for example formed of an alternation of GaN and InGaN layers having respective thicknesses from 5 to 20 nm (for example, 8 nm) and from 1 to 15 nm (for example, 2.5 nm). The GaN layers may be doped, for example, of type N or P. According to another example, the active layer may comprise a single InGaN layer, for example having a thickness greater than 10 nm.

The intermediate layer, for example, P-type doped, may correspond to a semiconductor layer or to a stack of layers and allows the forming of a P-N or P-I-N junction, the active layer being comprised between the intermediate P-type layer and the N-type semiconductor element 72, 92 of the P-N or P-I-N junction.

The bonding layer may correspond to a semiconductor layer or to a stack of semiconductor layers and enables to form an ohmic contact between the intermediate layer and transparent conductive layer 78. As an example, the bonding layer may be very heavily doped, with a doping type opposite to that of the semiconductor element, until degeneration of the semiconductor layer(s), for example, P-type doped at a concentration greater than or equal to $10^{20}$ atoms/cm$^3$.

The stack of semiconductor layers may comprise an electron barrier layer formed of a ternary alloy, for example, of aluminum gallium nitride (AlGaN) or of aluminum indium nitride (AlInN) in contact with the active layer and the intermediate layer, to ensure a good distribution of electric carriers in the active layer.

Transparent conductive layer 78 is capable of polarizing the active layer 74 covering semiconductor element 72, 92 and of giving way to the electromagnetic radiation emitted by light-emitting diode LED. The material forming layer 78 may be a transparent conductive material such as indium tin oxide (or ITO), zinc oxide doped or not with aluminum, boron, or gallium, tin oxide, gallium, zinc, indium tin or tungsten oxide, graphene, or a mixture of these materials. As an example, layer 78 has a thickness in the range from 5 nm to 500 nm, preferably from 20 nm to 100 nm. Layer 80 is made of an electrically-conductive material reflecting the radiation emitted by the active layer. Layer 80 may be made of a material selected from the group comprising silver (Ag), gold (Au), aluminum (Al), nickel silicide (NiSi), aluminum silicide (AlSi), rhodium (Rh), AlCu. As an example, layer 80 has a thickness in the range from 10 nm to 2 µm. Layer 80 may comprise a single layer or comprise a stack of at least two layers, one of which may ensure the electric contact only, for example, a layer made of a material selected from the group comprising titanium (Ti), titanium nitride (TiN), tungsten (W), tantalum nitride (TaN), ruthenium (Ru), or molybdenum (Mo).

Encapsulation layer 82 is made of an electrically-insulating material at least partly transparent to the radiation emitted by the active layer, for example, made of silicone, of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$) or of hafnium oxide ($HfO_2$). Encapsulation layer 82 may have a single-layer structure or a multiple-layer structure.

Figure 4:
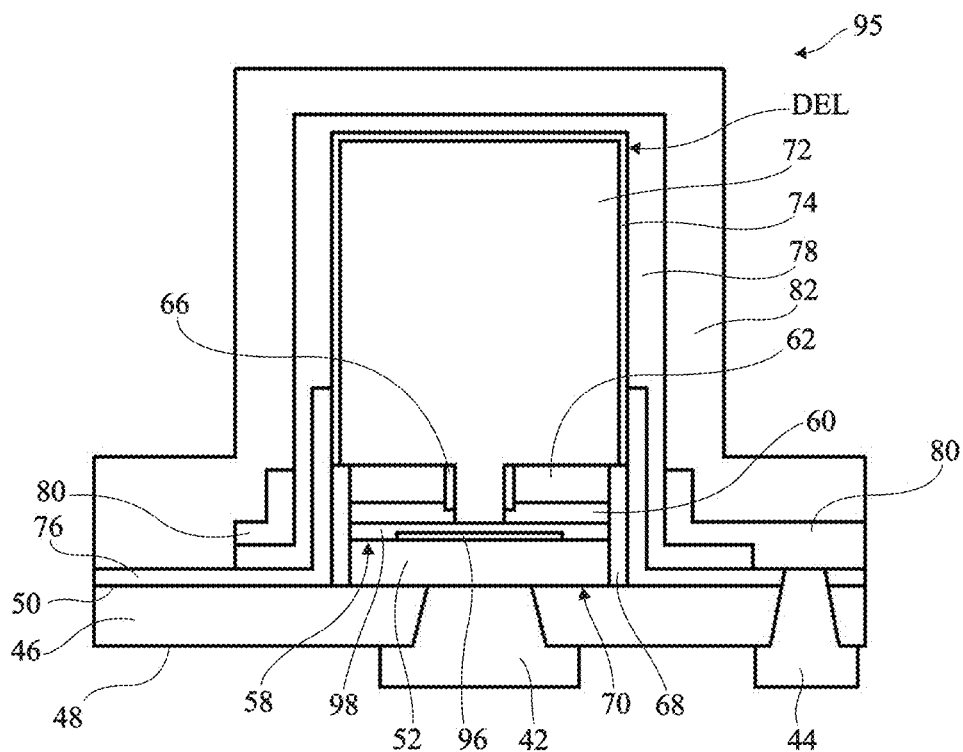

FIG. 4 is a partial simplified cross-section view of an optoelectronic device 95. Optoelectronic device 95 comprises all the elements of optoelectronic device 40, with the difference that nucleation layer 58 is formed of a stack of a first layer 96 and of a second layer 98 made of different materials. Each of layers 96 and 98 is made of one of the materials favoring the growth of the previously-indicated semiconductor elements 72, 92. Layer 98 is an electrically-conductive layer made of a material which is a better electric conductor than the material forming layer 96. Wire 72 is in contact with layer 98 and block 52 is in contact with layer 96. The thickness of layer 96 and the thickness of layer 98 may be in the range from 5 nm to 100 nm. According to an embodiment, in top view along axis D, the diameter of the circle inscribed within layer 96 is smaller than the diameter of the circle inscribed within layer 98 so that layer 98 is in contact with block 52. Layer 98 particularly provides a good electric contact with layer 52.

Figure 5:
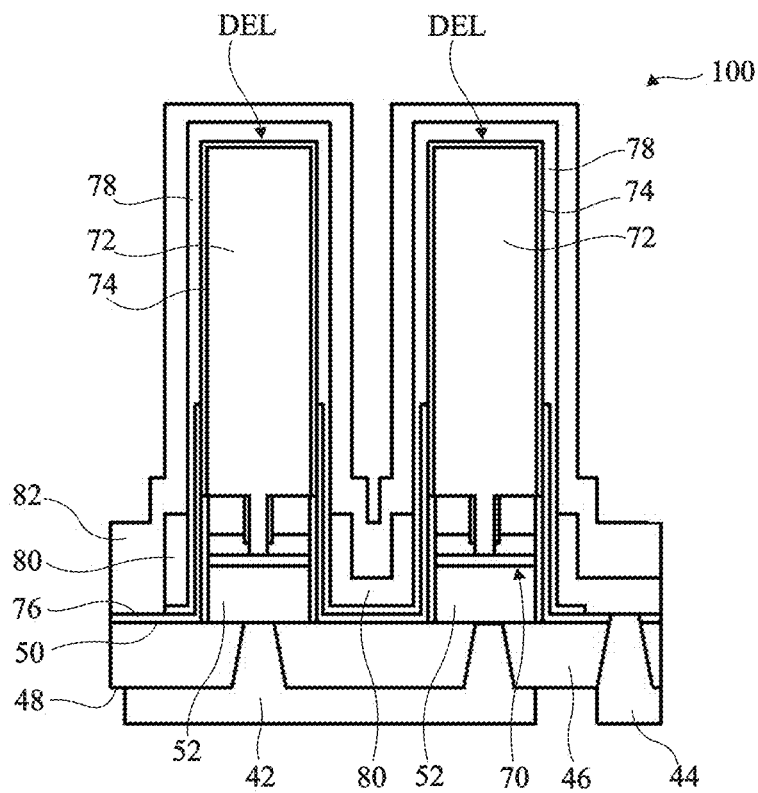

FIG. 5 is a partial simplified cross-section view of an optoelectronic device 100. Optoelectronic device 100 comprises all the elements of optoelectronic device 40, with the difference that electrode 42 is in contact with the blocks 52 associated with two light-emitting diodes LED, which are then controlled in parallel.

Figure 6:
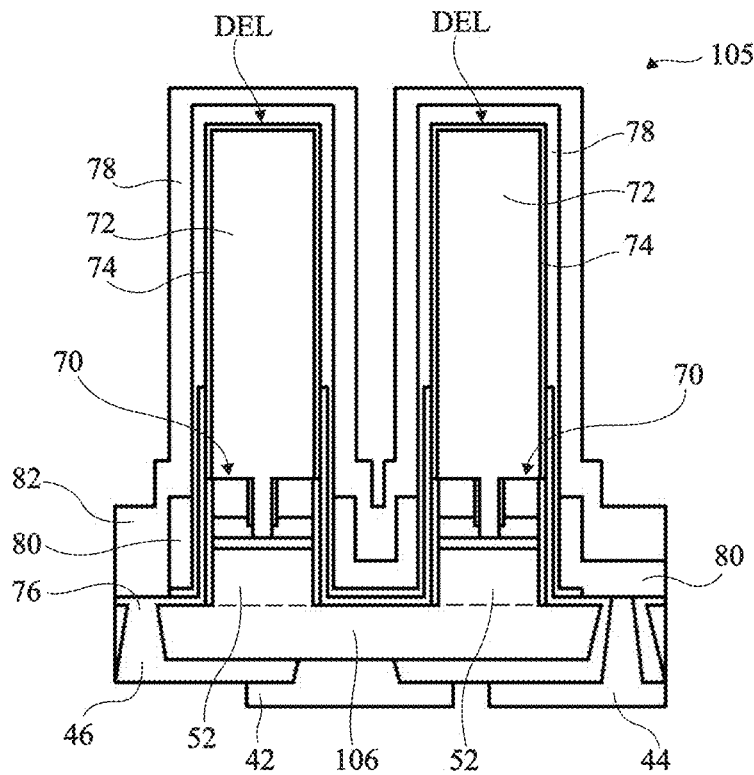

FIG. 6 is a partial simplified cross-section view of an optoelectronic device 105. Optoelectronic device 105 comprises all the elements of optoelectronic device 100, with the difference that support 46 further comprises a semiconductor portion 106 in contact with the blocks 52 associated with two light-emitting diodes LED and for example made of the same material as blocks 52. Electrode 42 is in contact with semiconductor portion 106.

Figure 7:
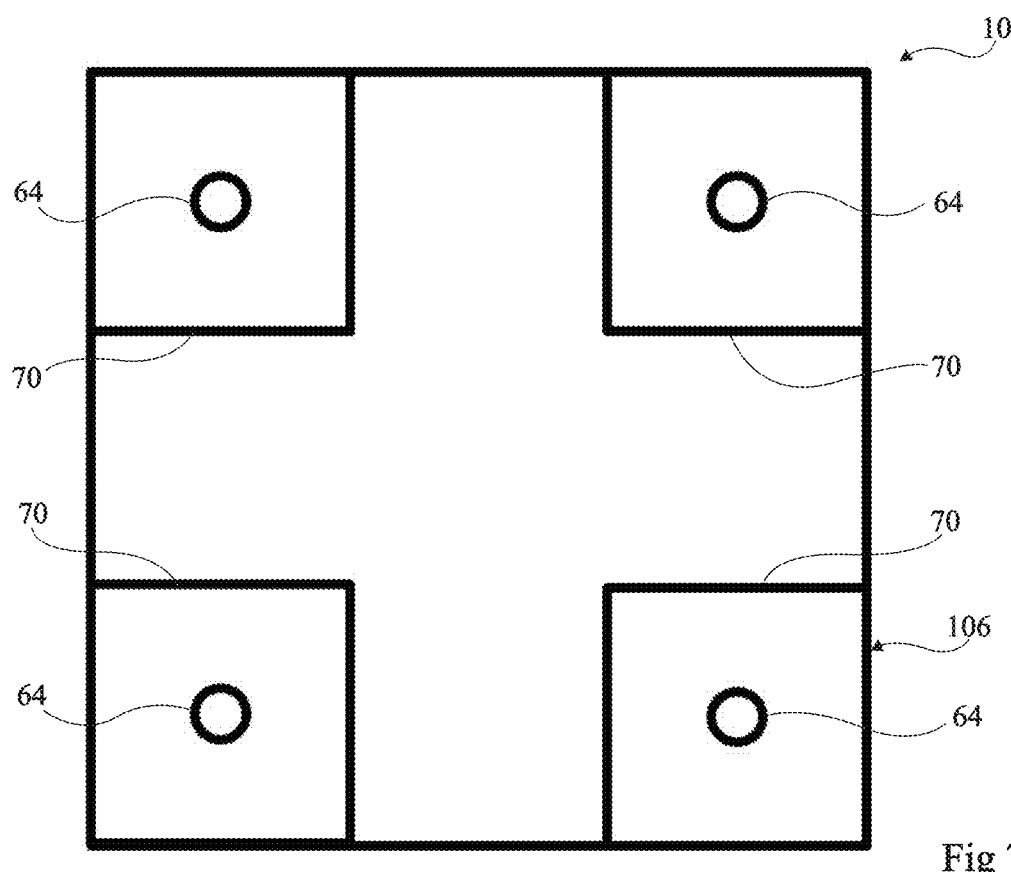
FIGS. 7 and 8 are partial simplified top views of embodiments of the optoelectronic device shown in FIG. 6.
Figure 8:
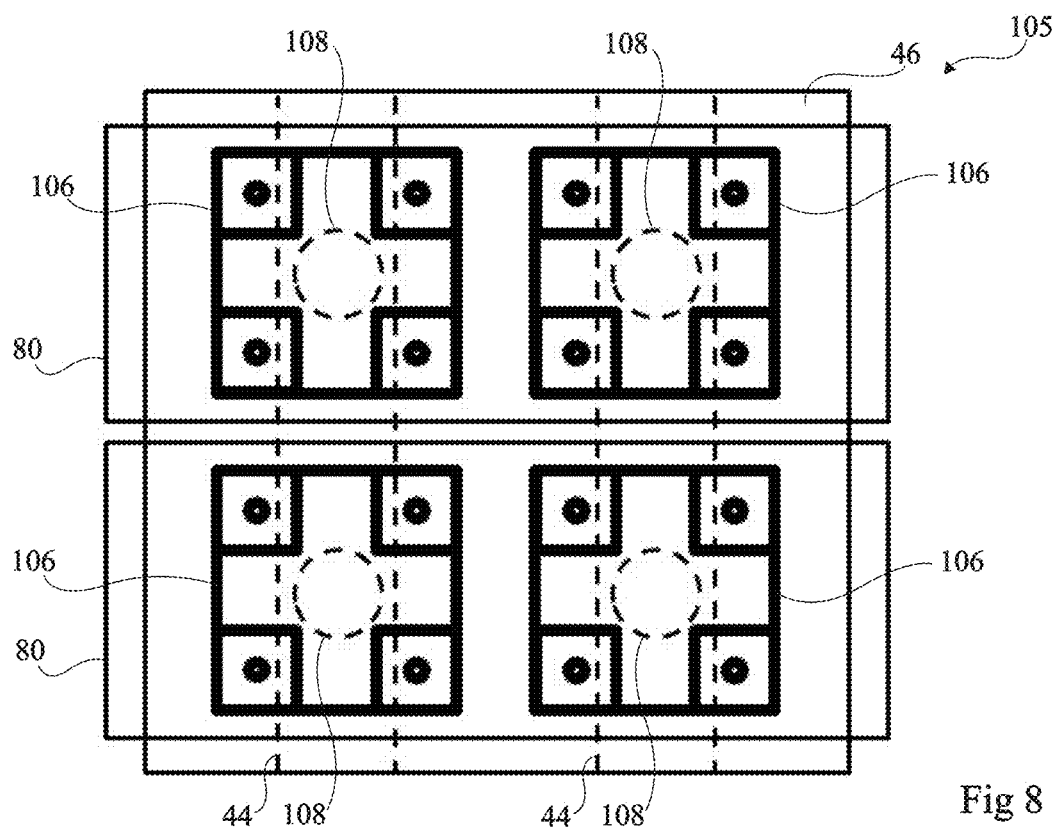

FIGS. 7 and 8 are partial simplified top views of embodiments of the optoelectronic device 105 shown in FIG. 6.

FIG. 7 is a top view of an embodiment of optoelectronic device 105 where only semiconductor portion 106 has been shown, having, as an example, a square shape in top view, and four pedestals 70 arranged at the four corners of semiconductor portion 106.

FIG. 8 is a top view of an embodiment of optoelectronic device 105 where four semiconductor portions 106 such as shown in FIG. 7, each comprising four pedestals 70, have been shown. Semiconductor portions 106 are, as an example, arranged in two rows and in two columns. Two conductive layers 80 have further been shown, each conductive layer 80 having the shape of a strip and being associated with two semiconductor portions 106. Two electrodes 44 have further been shown in dotted lines, having the shape of strips extending substantially perpendicularly to conductive layers 80. Further, the contact areas 108 between electrodes 44 and conductive layers 80 have been shown in dotted lines.

FIGS. 9A to 9K are partial simplified cross-section views of structures obtained at successive steps of an embodiment of a method of manufacturing the optoelectronic device 40 shown in FIG. 2.

Figure 9A:
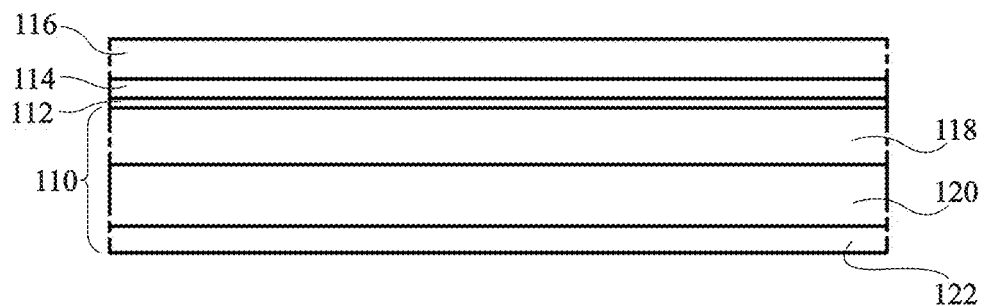
FIGS. 9A to 9K are partial simplified cross-section views of structures obtained at successive steps of an embodiment of a method of manufacturing the optoelectronic device shown in FIG. 2.

FIG. 9A shows the structure obtained after having successively grown, on a substrate 110, a nucleation layer 112, a first insulating layer 114, and a second insulating layer 116. Nucleation layer 112 has the same thickness and the same composition as the previously-described nucleation layer 58. First insulating layer 114 has the same thickness and the same composition as the previously-described first insulating layer 60. Second insulating layer 116 has the same thickness and the same composition as the previously-described second insulating layer 62.

Preferably, substrate 110 comprises a semiconductor layer 118, made of the same material as block 52, covering a support made of at least another material. Substrate 110 may correspond to a multiple-layer structure of silicon-on-insulator type, also called SOI, and may comprise semiconductor layer 118 covering an electrically-insulating layer 120, which corresponds to the previously-described support 46, insulating layer 120 covering a bulk 122, for example, made of semiconductor material. The materials forming layers 118 and 122 may have different dopings and crystal orientations.

The method of growing nucleation layer 112 may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HVPE) may be used. Further, methods such as evaporation or reactive cathode sputtering may be used.

Each insulating layer 114, 116 may be deposited as an example by plasma-enhanced chemical vapor deposition (PECVD), low-pressure chemical vapor deposition (LPCVD), sub-atmospheric chemical vapor deposition (SACVD), CVD, physical vapor deposition (PVD), or atomic layer deposition (ALD).

Figure 9B:
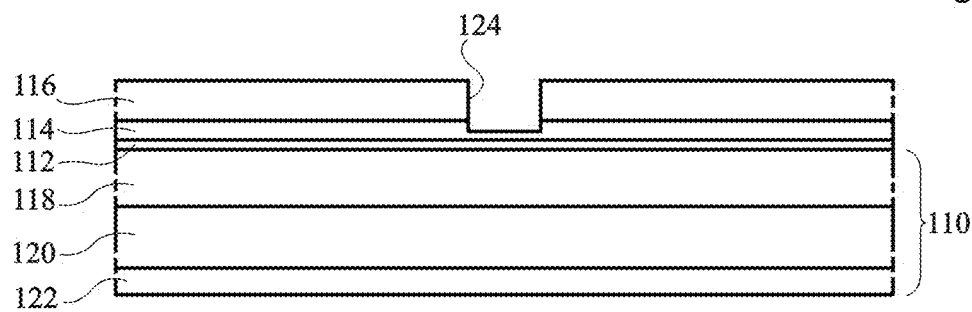

FIG. 9B shows the structure obtained after having formed, for each light-emitting diode, an opening 124 in second insulating layer 116 and in a portion of first insulating layer 114. Preferably, opening 124 does not extend all the way to nucleation layer 112. The etching of second insulating layer 116 and of first insulating layer 114 may be a wet or dry etching (plasma etching).

Figure 9C:
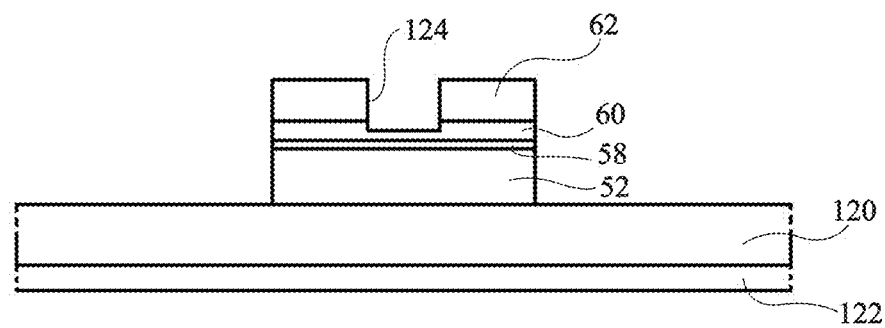

FIG. 9C shows the structure obtained after having successively etched second insulating layer 116, first insulating layer 114, nucleation layer 112, and semiconductor layer 118 to delimit, in each light-emitting diode, block 52, nucleation layer 58, first insulating layer 60, and second insulating layer 62.

The etching of second insulating layer 116, of first insulating layer 114, of nucleation layer 112, and of semiconductor layer 118 may be a wet or dry etching (plasma etching). Preferably, insulating layer 120 forms an etch stop layer during the etching of semiconductor layer 118. This enables to accurately control the obtained height of pedestal 70.

Figure 9D:
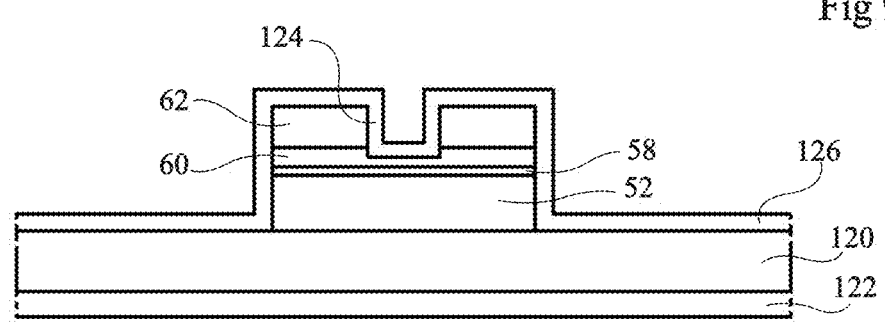

FIG. 9D shows the structure obtained after having formed an insulating layer 126 over the entire structure obtained at the previous step and particularly in each opening 124 and on the lateral sides of each block 52. Insulating layer 126 has the same thickness and the same composition as the previously-described coatings 66, 68. Insulating layer 126 may be formed by the methods previously described for the forming of insulating layers 114, 116.

Figure 9E:
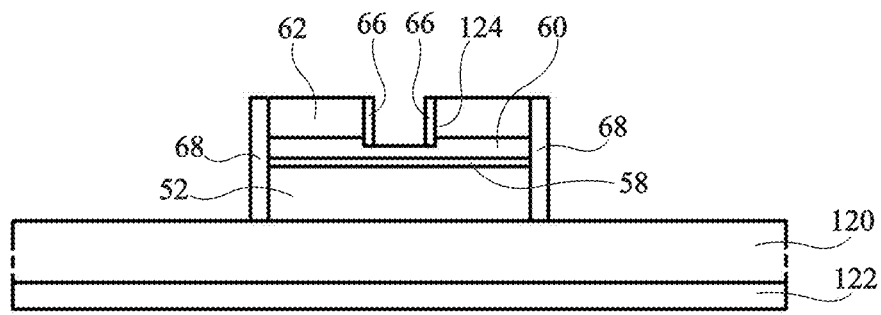

FIG. 9E shows the structure obtained after having etched insulating layer 126 to only keep coating 66 on the lateral sides of each opening 124 and coating 68 on the outer sides of each block 52. The etch stop is performed on insulating layer 120 and on insulating layer 60. The etching is an anisotropic etching, for example, a dry etching (particularly a plasma etching).

Figure 9F:
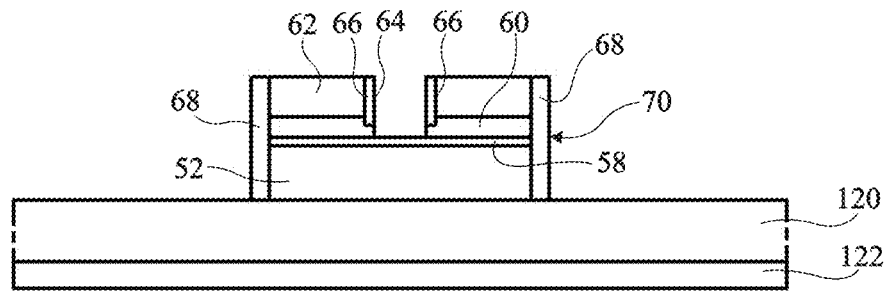

FIG. 9F shows the structure obtained after having continued each opening 124 to reach nucleation layer 58, in order to form previously-described opening 64. The etching may be stopped on nucleation layer 58. Pedestal 70 is then obtained for each light-emitting diode. The presence of coating 66 enables to form opening 64 with a smaller diameter than the minimum diameter that could be obtained by photolithography techniques.

Figure 9G:
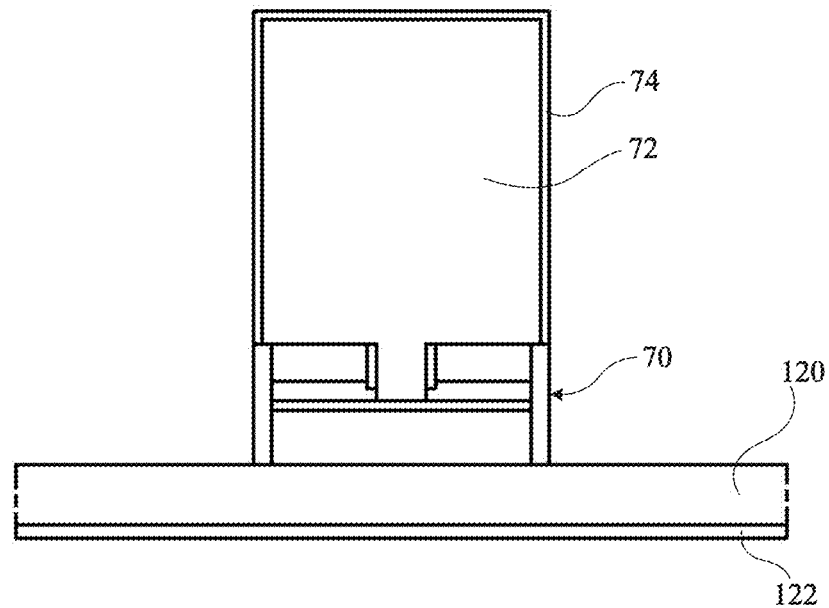

FIG. 9G shows the structure obtained after having, for each light-emitting diode, grown a wire 72 on each pedestal 70 and a shell 74 covering wire 72.

Wires 72 and the layers forming shells 74 may be grown by a method of CVD, MOCVD, MBE, GSMBE, MOMBE, PAMBE, ALE, or HVPE type. Further, electrochemical processes may also be used, for example, chemical bath deposition (CBD), hydrothermal processes, liquid aerosol pyrolysis, or electrodeposition. An example of a wire forming method is described in patent application US2015/0280053.

Figure 9H:
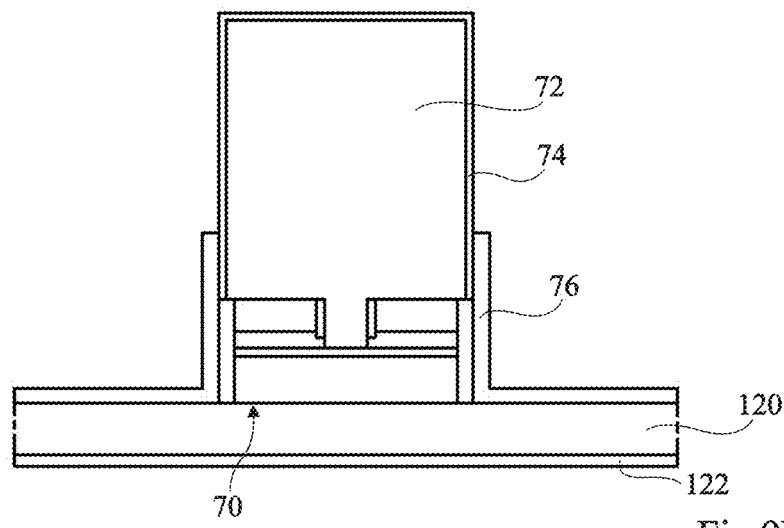

FIG. 9H shows the structure obtained after having formed insulating layer 76. This may be obtained by depositing an insulating layer over the entire structure obtained at the previous step, by depositing a resist layer over the entire structure, by partially etching the resist layer to expose an upper portion of each shell 74 covered with the insulating layer and by etching the portions of the insulating layer thus exposed. An example of a method of forming layer 76 is described in patent application WO2016/108023.

Figure 9I:
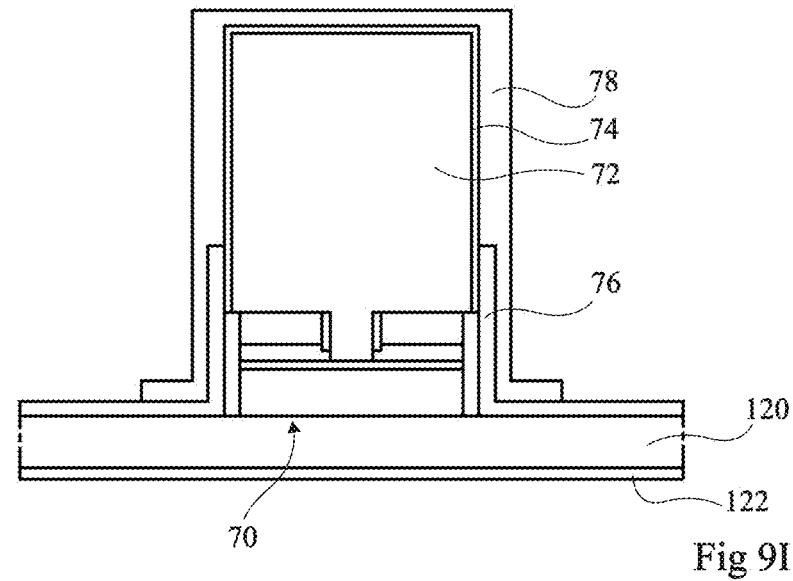

FIG. 9I shows the structure obtained after having formed transparent conductive layer 78. This may be obtained by depositing a transparent conductive layer over the entire structure obtained at the previous step, by protecting with a mask the portions to be kept of the conductive layer, and by removing the portions of the transparent conductive layer which are not covered with the mask.

Figure 9J:
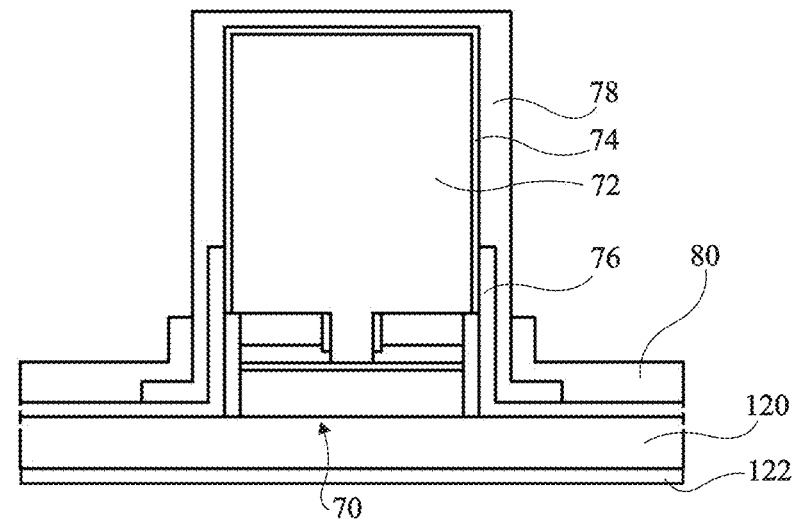

FIG. 9J shows the structure obtained after having formed conductive layer 80. This may be obtained by depositing a conductive layer over the entire structure obtained at the previous step, by depositing a resist layer over the entire structure, by partially etching the resist layer to expose an upper portion of each wire 72 covered with the conductive layer, and by etching the portions of the conductive layer thus exposed.

Figure 9K:
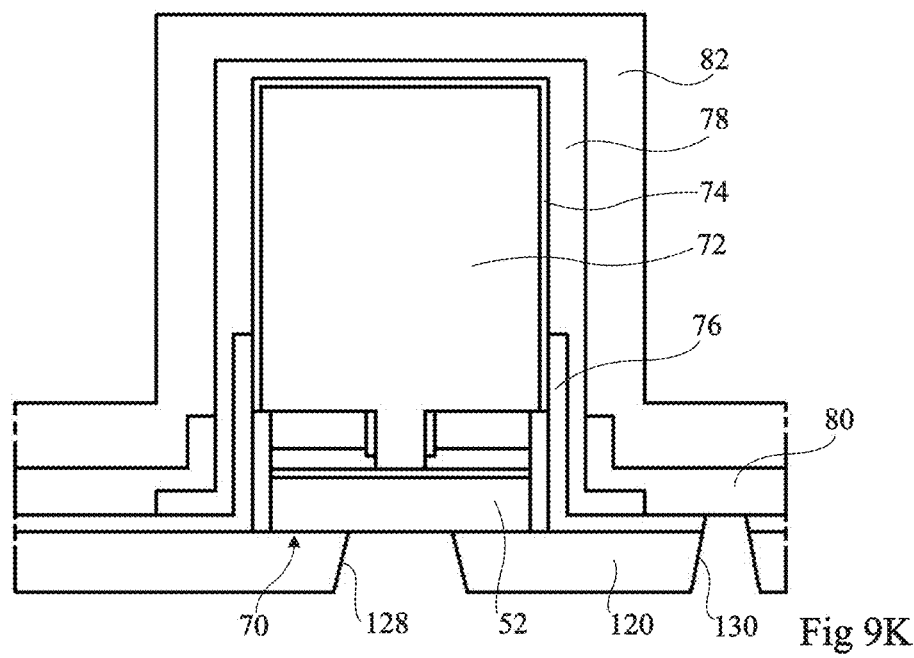

FIG. 9K shows the structure obtained after having formed encapsulation layer 82, after having removed bulk 122, for example, by polishing, by chem.-mech. planarization, or by chemical etching, and after having formed, for each light-emitting diode, a first opening 128 thoroughly crossing insulating layer 120 and exposing a portion of block 52 and a second opening 130 thoroughly crossing insulating layer 120 and insulating layer 76 and exposing a portion of conductive layer 80, as described in patent application US2016/0218240.

The final steps of the method comprise forming electrode 42 on the surface of insulating layer 120 opposite to block 52 and in opening 128 and forming electrode 44 on the surface of insulating layer 120 opposite to block 52 and in opening 130. Each electrode 42, 44 may be formed, as an example, by PVD, CVD, ALD, or by electrochemical deposition (ECD).

FIGS. 10A to 10D are partial simplified cross-section views of structures obtained at successive steps of an embodiment of a method of manufacturing the optoelectronic device 95 show in FIG. 4.

Figure 10A:
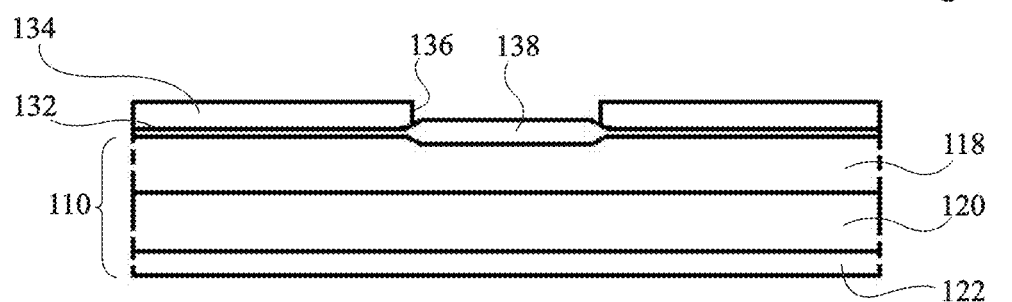
FIGS. 10A to 10D are partial simplified cross-section views of structures obtained at successive steps of an embodiment of a method of manufacturing the optoelectronic device shown in FIG. 4.

FIG. 10A shows the structure obtained after the steps of:
depositing an electrically-insulating layer 132 on the previously-described substrate 110;
depositing a mask 134 on insulating layer 132;
forming an opening 136 in mask 134 and in insulating layer 132 to expose a portion of semiconductor layer 118; and
forming by thermal oxidation an electrically-insulating portion 138 in opening 136, insulating portion 138 partly extending in semiconductor layer 118, for example, down to a depth in the range from 10 nm to 200 nm.

Figure 10B:
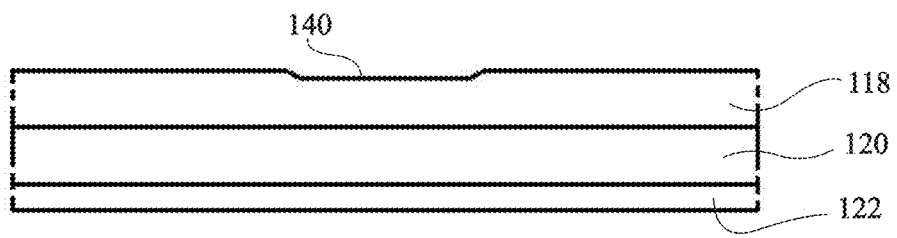

FIG. 10B shows the structure obtained after having removed mask 134, insulating layer 132, and insulating portion 138. There remains a recess 140 at the surface of semiconductor layer 118.

Figure 10C:
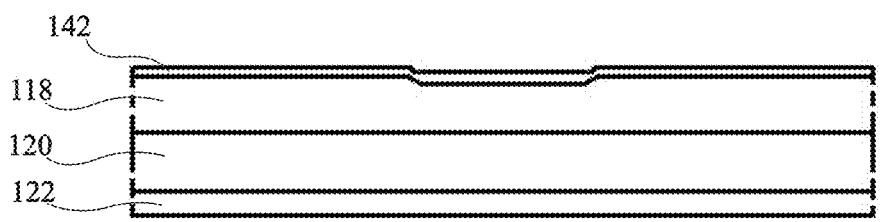

FIG. 10C shows the structure obtained after having deposited a first seed layer 142 over the entire structure obtained at the previous step, and particularly in recess 140. Seed layer 142 has the same thickness and the same composition as the previously-described seed layer 96.

Figure 10D:
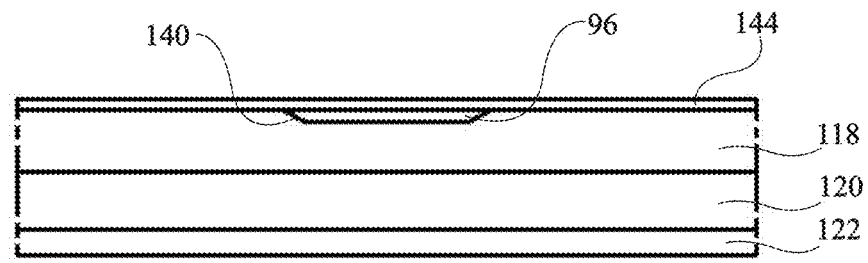

FIG. 10D shows the structure obtained after the steps of:
removing, for example, by chem.-mech. polishing or planarization, the portion of seed layer 142 outside of recess 140 to only keep seed layer 96 in recess 140; and
depositing an electrically-conductive nucleation layer 144 over the entire structure, having the same thickness and the same composition as the previously-described layer 98.

The next steps may be identical to the steps previously described in relation with FIGS. 9B to 9J.

Figure 11A:
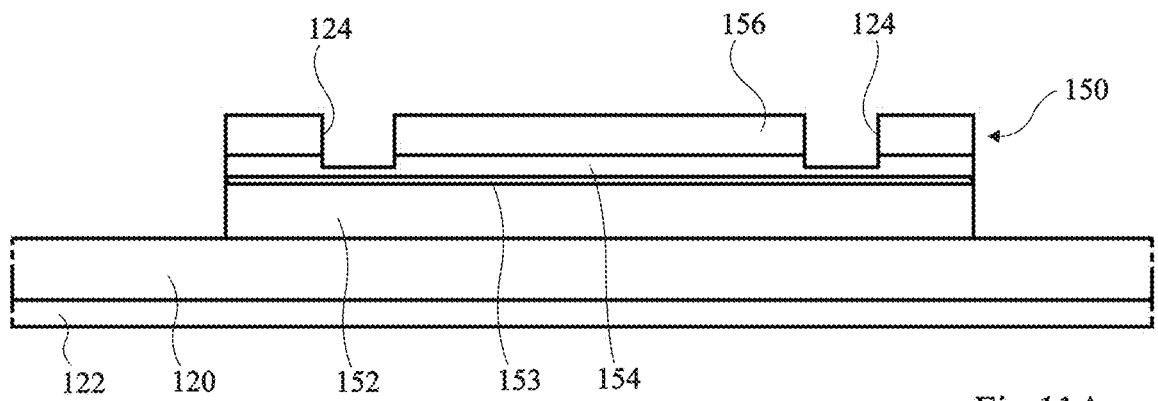
FIGS. 11A to 11C are partial simplified cross-section views of structures obtained at successive steps of an embodiment of a method of manufacturing the optoelectronic device shown in FIG. 6.
Figure 11B:
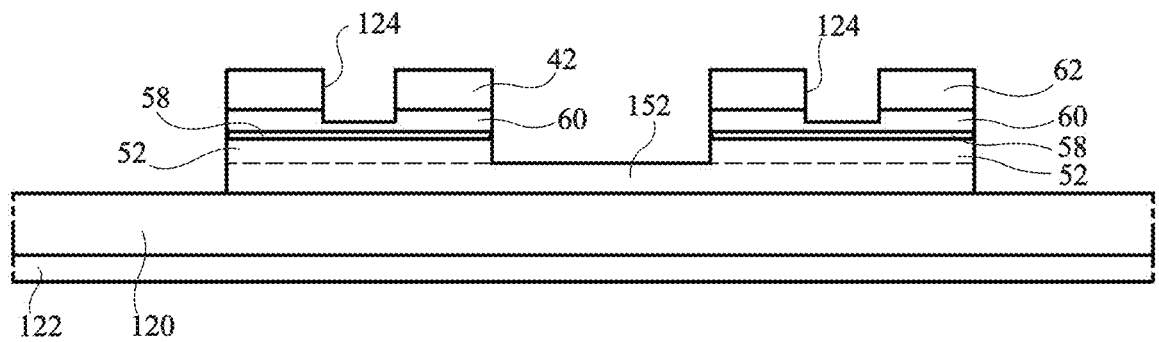
Figure 11C:
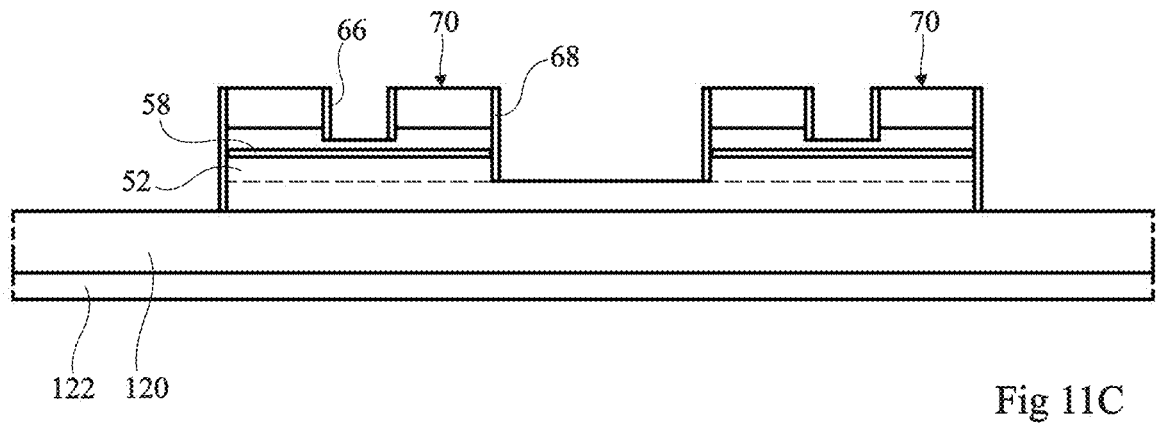

FIGS. 11A to 11C are partial simplified cross-section views of structures obtained at successive steps of an embodiment of a method of manufacturing the optoelectronic device 105 shown in FIG. 6.

The initial steps may be identical to the steps previously described in relation with FIGS. 9A and 9B.

FIG. 11A shows the structure obtained after having successively etched second insulating layer 116, first insulating layer 114, and semiconductor layer 118 to delimit an island 150 formed by the stacking of a portion 152 of semiconductor layer 118, of a portion 153 of nucleation layer 112, of a portion 154 of first insulating layer 114, and of a portion 156 of second insulating layer 116, the stack comprising at least two openings 124.

FIG. 11B shows the structure obtained after having successively etched insulating portion 156, insulating portion 154, nucleation portion 153, and a portion of semiconductor portion 152 to delimit, for each light-emitting diode, block 52, nucleation layer 58, first insulating layer 60, and second insulating layer 62, blocks 52 being electrically connected to one another by the rest of semiconductor portion 152.

FIG. 11C shows the structure obtained after steps similar to those previously described in relation with FIGS. 9D and 9E, which results, for each pedestal 70, in the forming of coatings 66 and 68.

The next steps may be identical to the steps previously described in relation with FIGS. 9F to 9K.

Various embodiments with different variations have been described hereabove. It should be noted that those skilled in the art may combine these various embodiments and variations without showing any inventive step. In particular, in the previously-described optoelectronic devices 95, 100, 105, wires 72 may be replaced with pyramids 92.

The invention claimed is:

1. An optoelectronic device comprising:
a support;
blocks of a semiconductor material, resting on the support and each comprising a first surface on the side opposite to the support and lateral walls;
a nucleation layer on each first surface;
a first electrically-insulating layer covering each nucleation layer and comprising an opening exposing a portion of the nucleation layer;
a semiconductor element resting on each first insulating layer and in contact with the nucleation layer covered with said first insulating layer in the opening;
a shell covering each semiconductor element and comprising an active layer capable of emitting or of absorbing an electromagnetic radiation; and
a first electrically-conductive layer, reflecting said radiation, extending between the semiconductor elements and extending over at least a portion of the lateral walls of the blocks, which first conductive layer does not extend over the lateral walls of the semiconductor elements, the first conductive layer extending over at least a portion of the lateral walls of each block along a height measured from the support smaller than the height of the block measured from the support.

2. The optoelectronic device of claim 1, further comprising a second electrically-insulating layer covering at least a lower portion of each semiconductor element.

3. The optoelectronic device of claim 1, further comprising a second electrically-conductive layer, at least partly transparent to said radiation and covering each shell.

4. The optoelectronic device of claim 3, further comprising an electrically-insulating encapsulation layer at least partly transparent to said radiation and covering the first and second electrically-conductive layers.

5. The optoelectronic device of claim 1, wherein each nucleation layer comprises at least one stack of a third electrically-conductive layer in contact with the associated semiconductor element and of a fourth layer less electrically conductive than the third conductive layer, in contact with the block and covered with the third conductive layer.

6. The optoelectronic device of claim 1, wherein the support comprises a third electrically-insulating layer having second and third opposite surfaces, the blocks resting on the third surface.

7. The optoelectronic device of claim 6, further comprising at least one first electrode partly extending over the fourth surface and in contact with one of the blocks through the third insulating layer and at least one second electrode in contact with the second conductive layer through the third insulating layer.

8. The optoelectronic device of claim 1, wherein the height of each block is in the range from 0.5 µm to 4 µm.

9. The optoelectronic device of claim 1, comprising a semiconductor portion in contact with at least two of the blocks.

10. The optoelectronic device of claim 1, wherein the semiconductor element is a nanowire, a microwire, or a nanometer- or micrometer-range pyramid.

11. The optoelectronic device of claim 1, wherein the semiconductor elements are, at least partly, made of a material selected from the group comprising III-V compounds, II-VI compounds, or group-IV semiconductors or compounds.

12. The optoelectronic device of claim 1, wherein each nucleation layer is at least partly made of aluminum nitride (AlN), of aluminum oxide ($Al_2O_3$), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate ($ZrB_2$), of zirconium nitride (ZrN), of silicon carbide (SiC), of tantalum carbide nitride (TaCN), of magnesium nitride in $Mg_xN_y$ form, where x is approximately equal to 3 and y is approximately equal to 2, for example, magnesium nitride in $Mg_3N_2$ form.

13. A method of manufacturing an optoelectronic device comprising the steps of:
    forming, on a support, blocks of a semiconductor material, each comprising a first surface on the side opposite to the support and the lateral walls, a nucleation layer on each first surface and a first electrically-insulating layer covering each nucleation layer and comprising an opening exposing a portion of the nucleation layer;
    forming a semiconductor element resting on each first insulating layer and in contact with the nucleation layer covered with said first insulating layer in the opening;
    forming a shell covering each semiconductor element and comprising an active layer capable of emitting or absorbing an electromagnetic radiation; and
    forming a first electrically-conductive layer, reflecting said radiation, extending between the semiconductor elements and extending over at least a portion of the lateral walls of the blocks, which first conductive layer does not extend over the lateral walls of the semiconductor elements, the first conductive layer extending over at least a portion of the lateral walls of each block along a height measured from the support smaller than the height of the block measured from the support.

14. The method of claim 13, further comprising forming a second electrically-insulating layer covering at least a lower portion of each semiconductor element.

15. The method of claim 13, further comprising forming a second electrically-conductive layer, at least partly transparent to said radiation and covering at least each shell.

16. The method of claim 15, further comprising forming an electrically-insulating encapsulation layer at least partly transparent to said radiation and covering the first and second electrically-conductive layers.

17. The method of claim 13, wherein the support comprises a third electrically-insulating layer having second and third opposite surfaces, the blocks being formed on the third surface.

18. The method of claim 17, further comprising forming at least one first electrode partly extending over the fourth surface and in contact with one of the blocks through the third insulating layer and forming at least one second electrode in contact with the second conductive layer through the third insulating layer.

19. The method of claim 13, comprising forming, on the support, a semiconductor portion, and forming, on the semiconductor portion, at least two of the blocks in contact with the semiconductor portion.

\* \* \* \* \*